(12) United States Patent
Chang et al.

(10) Patent No.: US 8,776,720 B2
(45) Date of Patent: Jul. 15, 2014

(54) LINEAR-TYPE MICROWAVE-EXCITED PLASMA SOURCE USING A SLOTTED RECTANGULAR WAVEGUIDE AS THE PLASMA EXCITER

(75) Inventors: Chih-Chen Chang, Taipei County (TW); Chih-Yung Chen, Hsinchu (TW); Chien-Chih Chen, Taichung County (TW)

(73) Assignee: Industrial Technology Research Institute, Hsinchu (TW)

( * ) Notice: Subject to any disclaimer, the term of this patent is extended or adjusted under 35 U.S.C. 154(b) by 138 days.

(21) Appl. No.: 12/830,657

(22) Filed: Jul. 6, 2010

(65) Prior Publication Data

US 2011/0271908 A1    Nov. 10, 2011

(30) Foreign Application Priority Data

May 4, 2010    (TW) ................. 99114155 A

(51) Int. Cl.
  C23C 16/00    (2006.01)
  C23F 1/00    (2006.01)
  H01L 21/306    (2006.01)
  H01J 37/32    (2006.01)
  H05H 1/46    (2006.01)

(52) U.S. Cl.
  CPC ............ *H05H 1/46* (2013.01); *H01J 37/32229* (2013.01); *H01J 37/32266* (2013.01)
  USPC .......... 118/723 MW; 156/345.41; 118/723 R

(58) Field of Classification Search
  CPC ................ H01J 37/32192; H01J 37/32229; H01J 37/32266; H05H 1/46
  USPC ...................... 118/723 MW, 723 R
  See application file for complete search history.

(56) References Cited

U.S. PATENT DOCUMENTS

| | | | | |
|---|---|---|---|---|
| 5,262,610 A * | 11/1993 | Huang et al. | ............. | 219/121.43 |
| 5,843,236 A | 12/1998 | Yoshiki et al. | | |
| 6,204,606 B1 * | 3/2001 | Spence et al. | ............ | 315/111.21 |
| 7,485,204 B2 * | 2/2009 | Matsuo et al. | ........... | 156/345.41 |
| 2002/0011310 A1 * | 1/2002 | Kamarehi et al. | ............ | 156/345 |
| 2004/0011291 A1 | 1/2004 | Delaunay et al. | | |
| 2009/0065480 A1 * | 3/2009 | Ohmi et al. | .................... | 216/69 |
| 2009/0151637 A1 * | 6/2009 | Chang et al. | .......... | 118/723 MW |

FOREIGN PATENT DOCUMENTS

| | | |
|---|---|---|
| DE | 2516103 A1 | 10/1975 |
| DE | 19812558 A1 | 9/1999 |
| WO | 2009/150968 A1 | 12/2009 |

OTHER PUBLICATIONS

German Patent OA: 10 2010 034 184.3; Aug. 8, 2011.
Chinese Patent Office issued Office Action Dec. 11, 2012.
Taiwan Patent Office, "Office Action", May 30, 2013.

* cited by examiner

*Primary Examiner* — Rakesh Dhingra
(74) *Attorney, Agent, or Firm* — WPAT, PC; Justin King

(57) ABSTRACT

A linear-type microwave-excited plasma source mainly comprises a reacting chamber, a rectangular waveguide and a linear biased slot in between. A linear quartz plate with an o-ring embedded in the biased slot is required so as to keep the reaction chamber in low pressure condition. Plasma will be excited in the reacting chamber by microwave powers radiating from the biased slot. A linear-type movable dielectric material can be disposed in the waveguide to control the radiation intensity of microwave, such that the length of the linear-type plasma source is able be extended without increasing input microwave powers and thus large-area low-cost plasma-processing applications can be implemented.

8 Claims, 4 Drawing Sheets

LINEAR-TYPE MICROWAVE-EXCITED PLASMA SOURCE USING A SLOTTED RECTANGULAR WAVEGUIDE AS THE PLASMA EXCITER

TECHNICAL FIELD

The present disclosure relates to a microwave plasma source, and more particularly, to a linear-type microwave-excited plasma source using a rectangular waveguide with a biased slot as the plasma exciter.

TECHNICAL BACKGROUND

In response to the rising of production capacity for silicon solar cell, the plasma enhanced chemical vapor deposition (PECVD) process for forming anti-reflection films is becoming the key process that required to be improved. That is, the plasma source used in the PECVD process has to be extended linearly in a direction perpendicular to the direction of conveyor movement. With linear extension of the microwave plasma source, the requirements including large-area plasma processing and high production capacity can be met. Thus, it is in need of an improved linear-type microwave-excited plasma source, which will be described in the present disclosure hereinafter.

Please refer to FIG. 1, which is the cross sectional sketch of a conventional linear-type microwave-excited plasma source disclosed in German patent DE 19812558A1. In FIG. 1, the conventional microwave-excited plasma source 100 comprises a reaction chamber 110, a quartz tube 120, a coaxial waveguide 130 and an inner conductor 135 therein. The coaxial waveguide 130 is disposed inside the quartz tube 120 while the quartz tube 120 is disposed inside the reaction chamber 110.

Thereby, when two microwave transmitters located at both ends of the coaxial waveguide 130 are used for launching microwaves from the two ends of the coaxial waveguide 130, the microwaves will travel inside the coaxial waveguide 130 and leaks out of the coaxial waveguide 130 by passing through the quartz tube 12 for exciting plasma 60 accordingly. The plasma meanwhile also plays a role of being the outer conductor of the coaxial waveguide 130. Then, by applying the plasma 60 on the surfaces of the silicon wafers 140, a thin-film deposition process is enabled.

Please refer to FIG. 2 and FIG. 3, which are two schematic diagrams showing the linearly distributed plasma excited by two different microwave powers launching from both sides of the coaxial waveguide. It is noted that the vertical axis in the Cartesian coordinate system in both FIG. 1 and FIG. 2 is used for representing plasma density and the horizontal axis is used for representing the linear positions. As shown in FIG. 1 and FIG. 2, the line $n_1$ represents the linear plasma density distribution excited by applying one microwave power launching from the left end to the right end of the coaxial waveguide 130 whereas it is decaying to the right; and relatively, the line $n_2$ represents the plasma distribution excited by applying the other microwave power launching from the right end to the left end of the coaxial waveguide 130 whereas it is decaying to the left. Thus, the actual plasma density n in the reaction chamber 110 is equal to the superposition of the plasma density of $n_1$ and the plasma density of $n_2$.

For the purposes of enlarging the area of plasma processing and raising the production capacity, linear extension of the liner-type microwave plasma source 100 is necessary. However, the longer the length of the liner-type microwave plasma source is extended, the less uniformly the linear plasma density will distribute. The reason is as follows. For linear extension of the plasma source 100, each of the two microwave powers will radiate to exhaust completely 130 far before reaching the other end of the coaxial waveguide 130 no matter each of them is being applied to the coaxial waveguide 130 through the left end or the right end. Therefore, the actual plasma density n in the reaction chamber 110, equal to the superposition of the plasma density $n_1$ and the plasma density $n_2$, will become less uniform; that is, the plasma density will be higher at the two sides in the reaction chamber 110 corresponding to the two ends of the coaxial waveguide 130 and lower in the middle, as shown in FIG. 2. Nevertheless, if there is a method to control the two microwave powers radiating into plasma 130 by making each of the microwave powers radiate to exhaust almost completely just before reaching the other end of the coaxial waveguide 130 no matter each of them is being applied to the waveguide 130 through the left end or the right end, the actual plasma density n in the reaction chamber 110 will become uniform as shown in FIG. 3. Although the uniformity of plasma density can be improved by increasing the input microwave powers from transmitters to make each of the microwave powers radiate to exhaust almost completely just before reaching the other end of the waveguide 130, however, arc-discharging happening at the two ends of the reaction chamber corresponding to two ends of the coaxial waveguide 130 will be exacerbated and is going to affect the stability of plasma excitation. In addition, because high-power microwave transmitters are very expensive, using such transmitters might be commercially uncompetitive.

Another issue is about maintenance. The quartz tube 120 soaking in the plasma will cause thin films being deposited on the outer surface of the quartz tube such that the coupling between microwave and plasma will change. Accordingly, the linearly distributed plasma density in the reaction chamber 110 will also be less uniform and thus adversely affect the quality of thin-film deposition on the silicon substrate 140.

Although the aforesaid problem can be solved by replacing the quartz tube regularly, such maintenance of replacement can be very time-consuming and consequently the production capacity may be reduced accordingly.

Therefore, it is in need of a linear-type microwave-excited plasma source using rectangular waveguide with a biased slot as the plasma exciter for overcoming the aforesaid problems.

TECHNICAL SUMMARY

The object of the present disclosure is to provide a linear-type microwave-excited plasma source using a rectangular waveguide with a biased slot as the plasma exciter, having advantages of large-area processing, low cost and minimum equipment wear and tear.

To achieve the above object, the present disclosure provides a linear-type microwave-excited plasma source using a rectangular waveguide with a biased slot as the plasma exciter, comprising: a reaction chamber; a rectangular waveguide, disposed on the reaction chamber, having a biased slot configured on a bottom wall of the rectangular waveguide at a position offsetting from the center line of the rectangular waveguide while enabling the waveguide to communicate with the reaction chamber through the biased slot, and enabling the bottom wall to be divided by the biased slot into a wide region and a narrow region; a dielectric plate often made of quartz or ceramic, is inset into the biased slot and sealed by a rubbery o-ring while being arranged at a position between the rectangular waveguide and the reaction chamber such that the reaction chamber can be kept in vacuum condition and the slotted rectangular waveguide serves as the plasma exciter. An adjustment device, configured with a dielectric screw rod and a movable dielectric block in a manner that the movable block is connected to the screw rod while being slidably received inside the rectangular waveguide so as to be driven to move by the screw rod.

The rectangular waveguide is further configured with a first vertical wall and a second vertical wall in a manner that the first vertical wall is connected to the wide region and the second vertical wall is connected to the narrow region. In an embodiment, the movable block is disposed in the wide region while allowing the movable block to be spaced from the second vertical wall by a first distance as the biased slot is disposed between the movable block and the second vertical wall, and consequently the screw rod is arranged passing through and normal to the first vertical wall so as to connect to the movable block by an end thereof that is inside the rectangular waveguide for enabling the first distance to be adjusted by the driving of the screw rod as the movable block is capable of being driven by the screw rod to move toward or away from the biased slot. In another embodiment, the movable block is disposed in the narrow region while allowing the movable block to be spaced from the first vertical wall by a second distance as the biased slot is disposed between the movable block and the first vertical wall, and consequently the screw rod is arranged passing through and normal to the second vertical wall so as to connect to the movable block by an end thereof that is inside the rectangular waveguide for enabling the second distance to be adjusted by driving the screw rod as the movable block is capable of being driven by the screw rod to move toward or away from the biased slot. By adjusting the first distance measured between the movable block and the second vertical wall, the microwave powers radiating from the waveguide slot into the reaction chamber can be controlled and adjusted for enabling the distribution of the linear plasma density to be uniform in the reaction chamber.

Further scope of applicability of the present application will become more apparent from the detailed description given hereinafter. However, it should be understood that the detailed description and specific examples, while indicating exemplary embodiments of the disclosure, are given by way of illustration only, since various changes and modifications within the spirit and scope of the disclosure will become apparent to those skilled in the art from this detailed description.

BRIEF DESCRIPTION OF THE DRAWINGS

The present disclosure will become more fully understood from the detailed description given herein below and the accompanying drawings which are given by way of illustration only, and thus are not limitative of the present disclosure and wherein.

DESCRIPTION OF THE EXEMPLARY EMBODIMENTS

For your esteemed members of reviewing committee to further understand and recognize the fulfilled functions and structural characteristics of the disclosure, several exemplary embodiments cooperating with detailed description are presented as the follows.

Figure 1:
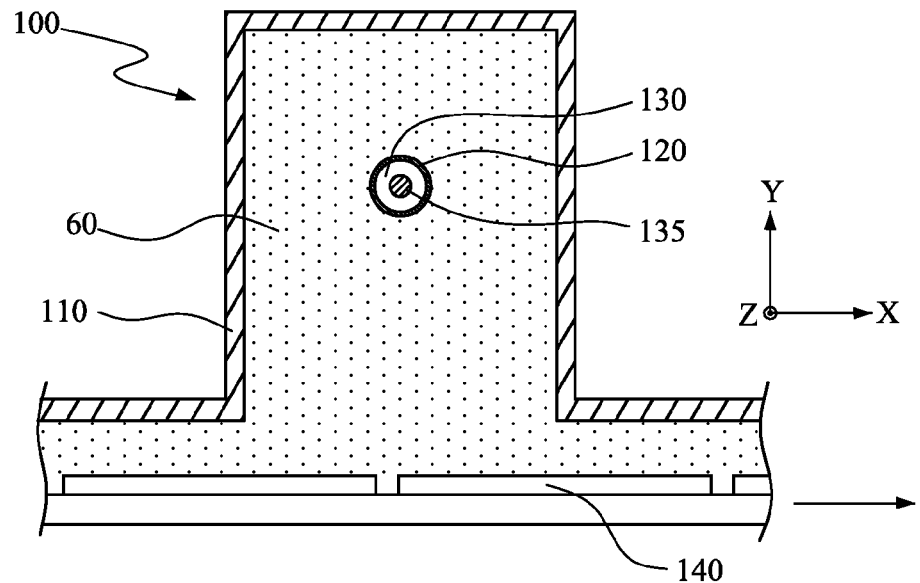
FIG. 1 is a cross sectional view of a conventional linear-type microwave-excited plasma source.
Figure 2:
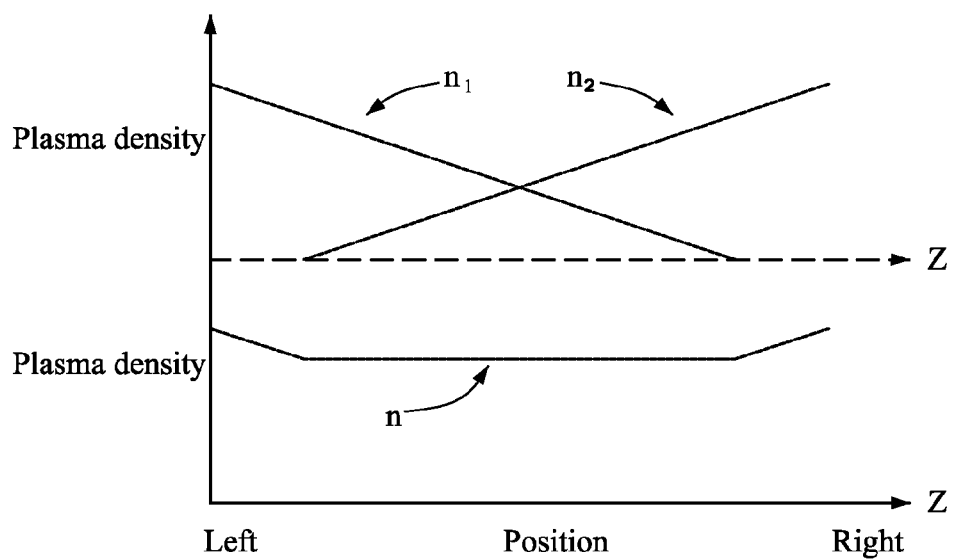
FIG. 2 is a schematic diagram showing the plasma density distribution enabled by a conventional linear-type microwave-excited plasma source.
Figure 3:
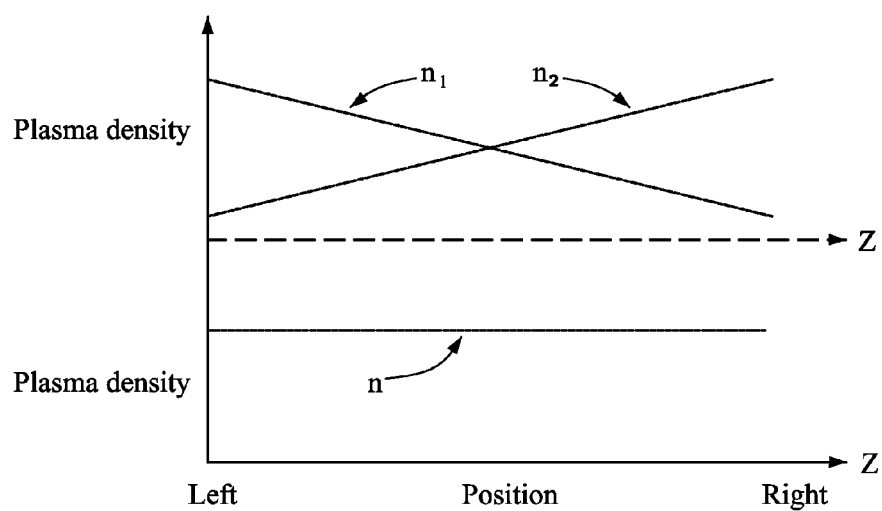
FIG. 3 is a schematic diagram showing the plasma density distribution enabled by another conventional linear-type microwave-excited plasma source.
Figure 4:
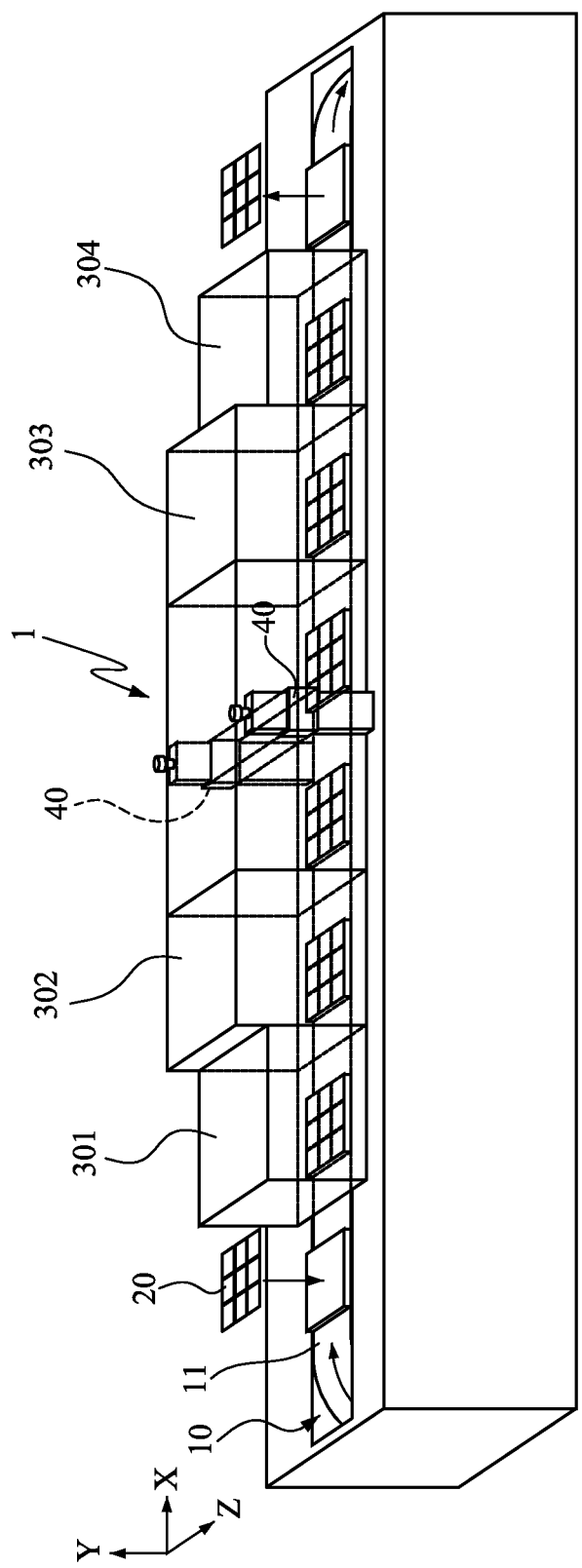
FIG. 4 shows a sketch of continuous conveyor-type plasma processor for silicon-wafer solar cells using a linear-type microwave-excited plasma source of the present disclosure.
Figure 5:
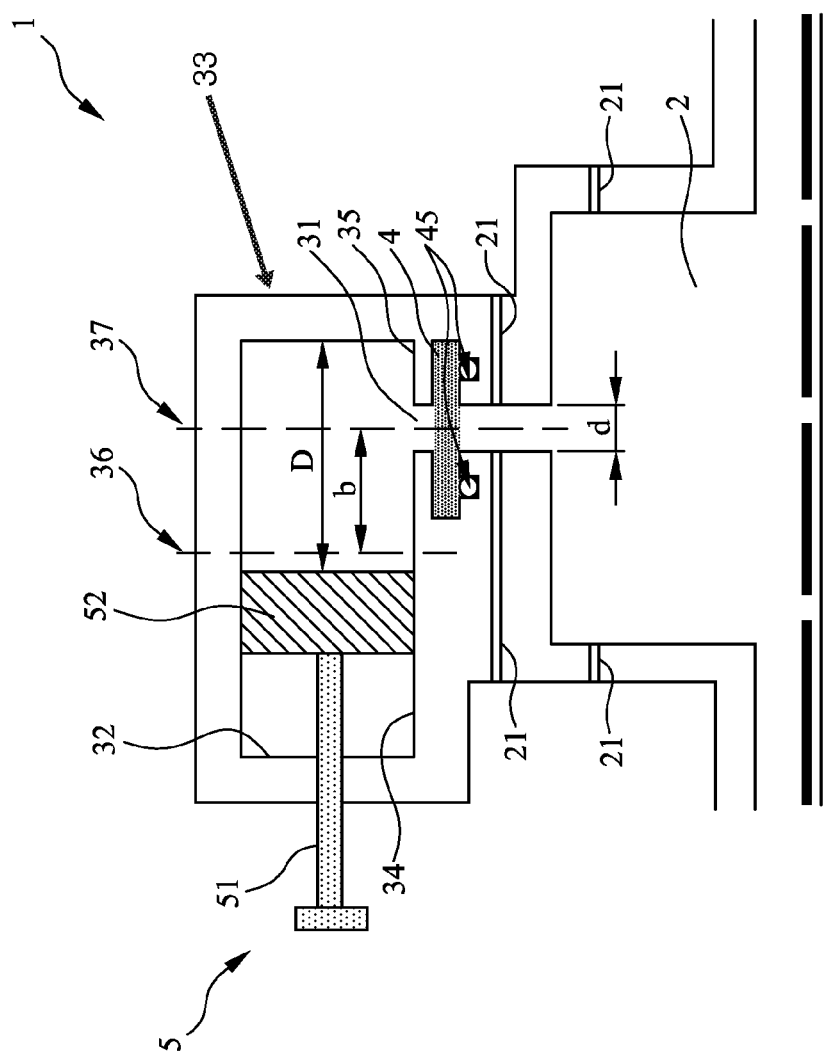
FIG. 5 is a cross sectional view of a linear-type microwave-excited plasma source according to an embodiment of the disclosure.

Please refer to FIG. 4 and FIG. 5, which are a schematic diagram showing a platform using a linear-type microwave-excited plasma source of the present disclosure and a cross sectional view of a linear-type microwave plasma source according to an embodiment of the disclosure.

In FIG. 4, a linear-type microwave-excited plasma source 1 of the present disclosure is disposed above the conveyor belt 11 of a transportation device 10, while a substrate 20 that is to be etched or being coated with film is placed on the transportation device 10 so as to be moved in an X-axis direction as defined in a Cartesian coordinate system shown in FIG. 4. Thus, the substrate 20 is enabled to travel sequentially through a loading stage 301, a heating stage 302, the linear-type microwave plasma source 1, a cooling stage 303 and a unloading stage 304, in which a loading process is performed upon the substrate 20 when it enters the loading stage 301, and a heating/decompress process is performed upon the substrate 20 when it enters the heating stage 302. It is noted that the substrate 20 entering the stage of the linear-type microwave-excited plasma source 1 after passing through the loading stage 301 and the heating stage 302 is subjected to a vacuum status so as to be processed by the linear-type microwave-excited plasma source 1. Thereafter, the substrate 20 is cooled and pressurized at the cooling stage 303 so that the substrate 20 arrived at the uploading stage 304, it is subjected to a status of one atmosphere pressure which is normal and the same to its ambient environment, so that it is ready to be processed by an uploading operation at the uploading stage 304. As shown in FIG. 4, the linear-type microwave-excited plasma source 1 is arranged for enabling its longitudinal axis to be parallel with the Z-axis of the Cartesian coordinate, whereas the two ends of the linear-type microwave-excited plasma source 1 with respect to the Z-axis direction are connected to two microwave transmitters 40.

As shown in FIG. 5, the linear-type microwave-excited plasma source 1 comprises a reaction chamber 2, multiple reaction gas inlets 21, a slotted rectangular waveguide 3, a quartz plate 4, a rubbery o-ring 45 and an adjustment device 5. In this embodiment, the reaction chamber 2 is disposed above the transportation device 10 in a manner that it is able to partially enclose and mask the substrate 20 therein when the substrate 20 is driven to move in the X-axis direction to be etched or coated.

Moreover, the rectangular waveguide 3 is further disposed above the reaction chamber 2, which has a biased slot 31 configured on a bottom wall of the waveguide at a position offsetting from the center of the rectangular waveguide with a biased distance b thereof enabling the bottom wall to be divided by the biased slot 31 into a wide region 34 and a narrow region 35. The dielectric plate 4 sealed a robbery o-ring 45, is inset into the biased slot 31 while being arranged at a position between the rectangular waveguide 3 and the reaction chamber 2. Moreover, as the rectangular waveguide 3 is configured with a first vertical wall 32 and a second vertical wall 33 that are arranged opposite to each other, the biased slot 31 can be arranged at a position close to the second vertical wall 33 while enabling the waveguide 3 to communicate with the reaction chamber 2 through the biased slot 31. It is noted that the biased distance b measured between the biased slot 31 and a center line of the rectangular waveguide 3, which is designed for the appropriate microwave radiation intensity radiated by the slot as the first-cut design. In addition, the radiation intensity will be further controlled by changing the first distance D after the plasma is excited, which will be described in detail as follows.

As shown in FIG. 5, the adjustment device for controlling the intensity of microwave radiation is comprised of a screw rod 51 and a movable block 52, whereas both of the screw rod 51 and the movable block can be made of dielectric materials. Moreover, the movable block 52 is connected to the screw rod 51 while being slidably received inside the rectangular waveguide 3 so as to be driven to move by the screw rod 51; and the adjustment device 5 is designed to perform an adjustment operation in a manual manner or in an automatic manner controlled by a program.

In detail, in an embodiment shown in FIG. 5, the movable block 52 is disposed on the bottom wall of the rectangular waveguide 3 at a position relating to the narrow region 35 and is spaced from the second vertical wall 33 by a distance D. The screw rod 51 is arranged passing through and normal to the first vertical wall 32 so as to connect to the movable block 52 for enabling the distance D to be adjusted by the driving of the screw rod 51 in a manner that the movable block 52 is capable of being driven by the screw rod 51 to move toward or away from the second vertical wall 33. Moreover, the distance b is defined to be the distance measured between the center line 36 of the rectangular waveguide and the center line 37 of the slot.

According to Paschen's law, the gas breakdown voltage $V_b$ of parallel plates in a gas as a function of pressure p and gap distance d, i.e. the width of the biased slot 31 in the present disclosure which is not restricted to a specified value. By differentiating the Paschen curve obtained from the Paschen's law with respect to pd and setting the derivative to zero, the minimum gas breakdown voltage can be found. Accordingly, when the pressure p is constant, it is able to prevent plasma from being excited in the biased slot 31 if the width d of the biased slot 31 is small enough, e.g. ranged form 5 mm to 10 mm, which will create a dark space between the quartz plate and plasma. Therefore, the quartz plate 4 will not contact plasma and thus will not be treated by plasma. That is, there will be no film deposited on the quartz plate 4. Consequently, the life span of the quartz plate 4 is prolonged and it will not be required to be replaced as often as those conventional microwave plasma source did, so that the overall production capacity can be increased.

With respect to the above description then, it is to be realized that the optimum dimensional relationships for the parts of the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by the present disclosure.

What is claimed is:

1. A linear-type microwave-excited plasma source using rectangular waveguide with a biased slot as the plasma exciter, comprising:
   a reaction chamber;
   a rectangular waveguide, disposed above the reaction chamber, the waveguide having a biased slot configured on a bottom wall of the waveguide at the position with a biased distance from the center line of the rectangular waveguide thereof while enabling the waveguide to communicate with the reaction chamber through the biased slot, the bottom wall of the rectangular waveguide being a longer wall, and enabling the bottom wall to be divided by the biased slot into a wide region and a narrow region;
   the rectangular waveguide being coupled at its two ends to two microwave transmitters;
   a first vertical wall of the rectangular waveguide, being disposed connecting to the wide region;
   a second vertical wall of the rectangular waveguide, being disposed connecting to the narrow region;
   reaction gas inlets located in the biased slot as well as on the inside walls of the reaction chamber;
   a quartz plate, detachably inset into the biased slot while being arranged at a position between the slotted rectangular waveguide and the reaction chamber; and
   an adjustment device, movably arranged inside the rectangular waveguide so as to move perpendicular to a length of the biased slot, comprising a dielectric screw rod and a dielectric movable block in a manner that the movable block is connected to the screw rod while being movably received inside the rectangular waveguide so as to be driven to move by the screw rod along the wide region of the bottom wall, thereby controlling distribution of linear plasma density in the reaction chamber;
   wherein the dielectric screw rod is arranged passing through and normal to the first vertical wall so as to connect to the dielectric movable block by an end inside the rectangular waveguide, enabling distance between the second vertical wall and the dielectric movable block to be adjusted by the driving of the screw rod as the movable block is driven by the screw rod to move the dielectric movable block relative to the biased slot such that microwave energy radiating through the biased slot into the reaction chamber is controlled and adjusted to provide uniform distribution of the linear plasma density in the reaction chamber.

2. The linear-type microwave-excited plasma source of claim 1, wherein the movable block is disposed on the bottom wall of the rectangular waveguide and is spaced from the second vertical wall by a distance and consequently the screw rod is arranged passing through and normal to the first vertical wall so as to connect to the movable block for enabling the distance to be adjusted by driving the screw rod such that the movable block is capable of being driven by the screw rod to move toward or away from the second vertical wall.

3. The linear-type microwave-excited plasma source of claim 1, wherein there is a transportation device arranged at a position under the reaction chamber to be used for performing a transportation operation in a direction perpendicular to the extending direction of the biased slot.

4. The linear-type microwave-excited plasma source of claim 1, wherein the adjustment device is designed to perform an adjustment operation in a manual manner or an automatic manner.

5. The linear-type microwave-excited plasma source of claim 1, wherein a biased distance between the center line of the biased slot and the center line of the rectangular waveguide is not restricted to a specified value; also another offset distance between the biased slot and a second vertical wall of the waveguide is not restricted to a specified value.

6. The linear-type microwave-excited plasma source of claim 1, wherein the width of the biased slot is not restricted to a specified value.

7. The linear-type microwave-excited plasma source of claim 1, reaction gas inlets can be located in the slot as well as on the inside walls of the reaction chamber.

8. The linear-type microwave plasma source of claim 1, wherein the dielectric plate is inset into the biased slot and sealed in place by a rubbery o-ring to keep the reaction chamber in a low-pressure condition.

* * * * *